United States Patent
Zhang et al.

(10) Patent No.: US 8,643,426 B2
(45) Date of Patent: Feb. 4, 2014

(54) VOLTAGE LEVEL SHIFTER

(75) Inventors: Wenzhong Zhang, Tianjin (CN); Yin Guo, Tianjin (CN); Shayan Zhang, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/605,987

(22) Filed: Sep. 6, 2012

(65) Prior Publication Data

US 2013/0222037 A1 Aug. 29, 2013

(30) Foreign Application Priority Data

Feb. 28, 2012 (CN) .......................... 2012 1 0047612

(51) Int. Cl.
*H03L 5/00* (2006.01)

(52) U.S. Cl.
USPC ............................................ 327/333; 326/81

(58) Field of Classification Search
USPC ..................... 327/333; 326/62, 63, 80, 81
See application file for complete search history.

(56) References Cited

U.S. PATENT DOCUMENTS

| | | | |
|---|---|---|---|
| 5,457,420 A | 10/1995 | Asada | |
| 6,275,070 B1 | 8/2001 | Pantelakis | |
| 6,677,798 B2 | 1/2004 | Chang | |
| 6,864,718 B2 * | 3/2005 | Yu | 326/68 |
| 6,954,100 B2 | 10/2005 | Dharne | |
| 7,002,371 B2 | 2/2006 | Kase | |
| 7,009,424 B2 | 3/2006 | Khan | |
| 7,034,573 B1 | 4/2006 | Chang | |
| 7,151,400 B2 * | 12/2006 | Chen | 327/333 |
| 7,183,817 B2 | 2/2007 | Sanchez | |
| 7,245,152 B2 | 7/2007 | Wich | |
| 7,268,588 B2 | 9/2007 | Sanchez | |
| 7,310,012 B2 * | 12/2007 | Chen | 327/333 |
| 7,362,137 B2 | 4/2008 | Williams | |
| 7,382,158 B2 | 6/2008 | Kimura | |
| 7,397,297 B2 | 7/2008 | Kimura | |
| 7,443,223 B2 | 10/2008 | Bajkowshi | |
| 7,446,566 B1 | 11/2008 | Chrudimsky | |
| 7,501,876 B2 | 3/2009 | Kimura | |
| 7,548,093 B1 | 6/2009 | Priel | |
| 7,560,970 B2 | 7/2009 | Cook | |
| 7,683,668 B1 | 3/2010 | Thakur | |
| 7,956,662 B2 | 6/2011 | Arora | |
| 2005/0285658 A1 * | 12/2005 | Schulmeyer et al. | 327/333 |
| 2006/0226874 A1 | 10/2006 | Kim | |
| 2007/0279091 A1 * | 12/2007 | Goel et al. | 326/71 |
| 2010/0109744 A1 * | 5/2010 | Czech et al. | 327/333 |
| 2011/0001538 A1 | 1/2011 | Alam | |
| 2011/0199139 A1 | 8/2011 | Arora et al. | |

\* cited by examiner

*Primary Examiner* — Patrick O'Neill
(74) *Attorney, Agent, or Firm* — Charles Bergere

(57) ABSTRACT

A voltage level shifter has an input circuit with an inverter coupled to an input node, a pull-down control transistor with a gate coupled to a first node of the inverter, and a pull-up control transistor with a gate coupled to a second node of the inverter. Sources of the pull-down and pull-up control transistors are coupled to a low voltage reference. A transient connectivity limiter (TCL) has pull-down and pull-up transistors. Two control inputs are coupled to respective first and second nodes of the inverter and path inputs are coupled to respective drains of the pull-down and pull-up control transistors. An output circuit has inputs coupled to pull-up and pull-down nodes of the TCL. During a voltage level transition at the input node, the TCL connects the pull-up node to the low voltage reference through the TCL pull-up transistor transitioning from a saturation to a sub-threshold region of operation.

17 Claims, 6 Drawing Sheets

VOLTAGE LEVEL SHIFTER

BACKGROUND OF THE INVENTION

The present invention relates to a voltage level shifter and, more particularly, to a voltage level shifter for shifting signal levels from a low voltage level to a higher voltage level.

Integrated circuits typically have peripheral or input/output (I/O) circuitry and internal core circuitry. The internal core circuitry often performs various processing-specific functions as fast as possible with minimal power consumption. As a result, power supply voltages that are used to power the core circuitry have been getting smaller. The I/O circuitry drives or provides signals from the core to external circuits at a specified signal power and voltage levels. The I/O circuitry also is frequently required to interface with various interface standards.

In view of the above, there is a need for high-speed, point-to-point interface communications between lower supply voltage chip level core circuitry signals, e.g., around 1 Volt (V) or less, and external circuits operating at higher voltage levels (e.g., 2.5V, 3.3V, or higher). Also, many systems, and even internal core circuitry, are designed with a variety of technologies operating at multiple voltage levels. It has also been found to be very challenging to provide level shifting circuits and output buffer circuits that interface multiple voltage levels while operating at the desired limits of the I/O speed and power consumption. It would therefore be desirable if a level shifter circuit could be implemented that can provide relatively high speed voltage output transitions without requiring relatively high levels of power consumption.

BRIEF DESCRIPTION OF THE DRAWINGS

The invention, together with objects and advantages thereof, may best be understood by reference to the following description of preferred embodiments together with the accompanying drawings, where the same reference numbers are used for like elements, in which.

DETAILED DESCRIPTION OF PREFERRED EMBODIMENTS

Figure 1:
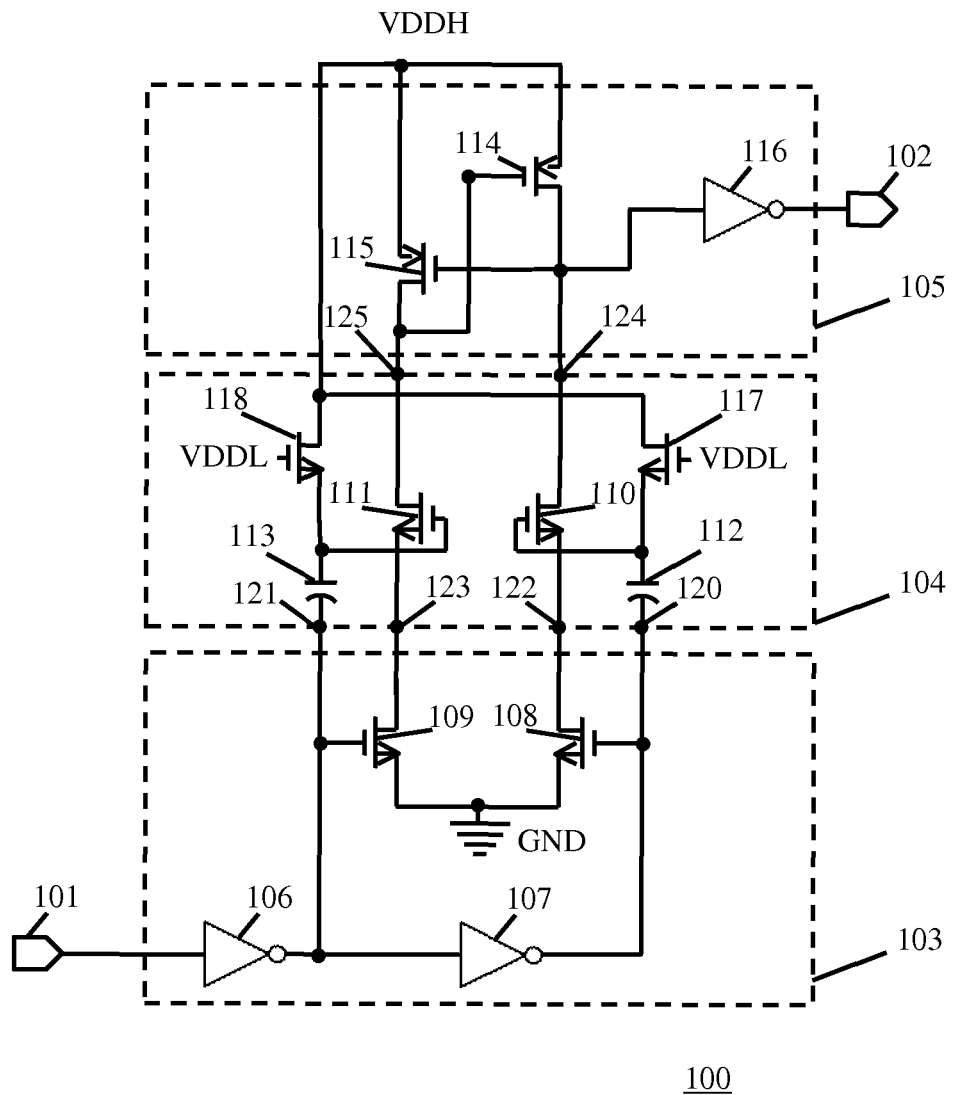
FIG. 1 is a schematic circuit diagram of a voltage level shifter in accordance with a preferred embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. The terms "comprises," "comprising," or any other variation thereof, are intended to cover a non-exclusive inclusion, such that module, circuit, device components and structures that comprise a list of elements do not include only those elements but may include other elements not expressly listed or inherent to such module, circuit or device components. An element proceeded by "comprises . . . a" does not, without more constraints, preclude the existence of additional identical elements that comprise the element or step. Furthermore, in this specification, the terms gate, source and drain can be interchanged respectively with the terms base, emitter and collector.

It also is to be understood that the states of a transistor as discussed in this specification include a sub-threshold region of operation and saturation region of operation. These regions of operation are well known in the field and so are the phrases non-conducting state and conducting state in which conducting state can be interchanged with the saturation region of operation or the phrases "switched on" or "turned on". Similarly, the non-conducting state can be interchanged with the phrases "switched off" or "turned off".

In one embodiment, the present invention provides a voltage level shifter comprising an input node and an output node. An input circuit has an input inverter coupled to the input node. The input circuit has a pull-down transistor with a gate electrode coupled to a first node of the input inverter. There is also a pull-up control transistor with a gate electrode coupled to an opposite second node of the inverter. Source electrodes of the pull-down transistor and pull-up control transistor are coupled to a low voltage reference node.

The voltage level shifter has a transient path connectivity limiter with a pull-down transient connectivity limiter transistor and a pull-up transient connectivity limiter transistor. The pull-down transient connectivity limiter transistor has a gate electrode coupled through a first capacitor to the first node of the inverter and a source electrode of the pull-down transient connectivity limiter transistor is coupled to a drain electrode of the pull-down transistor. The pull-up transient connectivity limiter transistor has a gate electrode coupled through a second capacitor to the second node of the inverter and a source electrode of the pull-up transient connectivity limiter transistor is coupled to a drain electrode of the pull-up control transistor.

The voltage level shifter also includes an output circuit that has a pull-up transistor with source and drain electrodes coupled between a primary voltage supply node and a drain electrode of the pull-down transient connectivity limiter transistor. The drain electrode of the pull-up transistor is coupled to the output node and a gate electrode of the pull-up transistor is coupled to a drain electrode of the pull-up transient connectivity limiter transistor. The output circuit also includes a pull-up control transistor that has source and drain electrodes coupled between the primary voltage supply and the drain electrode of the pull-up transient connectivity limiter transistor. Furthermore, the gate electrode of the pull-up control transistor is coupled to the drain electrode of the pull-down transient connectivity limiter transistor.

In another embodiment, the present invention provides a voltage level shifter comprising an input node and an output node. An input circuit has an input inverter coupled to the input node, and a pull-down transistor with a gate electrode coupled to a first node of the inverter. A pull-up control transistor has a gate electrode coupled to an opposite second node of the inverter. Source electrodes of the pull-down transistor and pull-up control transistor are coupled to a low voltage reference node.

The voltage level shifter has a transient path connectivity limiter that has a pull-down transient connectivity limiter transistor and pull-up transient connectivity limiter transistor. There are two control inputs coupled to respective first and second nodes of the inverter and path inputs are coupled to respective drain electrodes of the pull-down transistor and pull-up control transistor.

The voltage level shifter also includes an output circuit that has a pull-up transistor with source and drain electrodes coupled between a primary voltage supply node and a pull-down node of the transient path connectivity limiter. The drain electrode of the pull-up transistor is coupled to the output node and a gate electrode of the pull-up transistor is coupled to a pull-up control node of the transient connectivity limiter. The output circuit further comprises a pull-up control transistor having source and drain electrodes coupled between the primary voltage supply and the pull-up control node. Also, a gate electrode of the pull-up control transistors coupled to the pull-down node.

During a first transition between voltage levels at the input node, the transient path connectivity limiter connects the pull-up control node to the low voltage reference node through the pull-up transient connectivity limiter transistor transitioning from a saturation region of operation to a sub-threshold region of operation. Furthermore, during the first transition between voltage levels the input node the transient path connectivity limiter further connects the pull-down control node to the low voltage reference node through the pull-down transient connectivity limiter transistor transitioning from a sub-threshold region of operation to a saturation region of operation.

Referring now to FIG. 1, a circuit diagram of a voltage level shifter 100 in accordance with a first preferred embodiment of the present invention is shown. The voltage level shifter 100 includes an input node 101 and an output node 102. The voltage level shifter also includes an input circuit 103, a transient path connectivity limiter 104, and an output circuit 105.

The input circuit 103 has an input inverter 107 coupled to the input node 101 via an initial inverter 106. A pull-down transistor 108 has a gate electrode coupled to a first node of the inverter 107, and a pull-up control transistor 109 with a gate electrode coupled to an opposite second node of the inverter 107. Source electrodes of the pull-down transistor 108 and pull-up control transistor 109 are coupled to a low voltage reference node GND that is typically a node of a ground GND rail.

In this embodiment the first node of the inverter 107 is the output of the inverter 107 and the second node of the inverter 107 is the input of the inverter 107. Also, the output of the initial inverter 106 is coupled to the input of the inverter 107 and the input of the initial inverter is coupled to the input node 101.

The transient path connectivity limiter 104 has a pull-down transient connectivity limiter transistor 110 and a pull-up transient connectivity limiter transistor 111. The pull-down transient connectivity limiter transistor 110 has a gate electrode coupled through a first capacitor 112, via a first control input 120, to the first node of the input inverter 107. A source electrode of the pull-down transient connectivity limiter transistor 110 is coupled to a drain electrode of the pull-down transistor 108 via a first path input node 122 of the transient path connectivity limiter 104.

The pull-up transient connectivity limiter transistor 111 has a gate electrode coupled through a second capacitor 113, via a second control input 121, to the second node of the inverter 107. A source electrode of the pull-up transient connectivity limiter transistor 111 is coupled to a drain electrode of the pull-up control transistor 109 via a second path input node 123 of the transient path connectivity limiter 104.

The transient path connectivity limiter 104 has a rapid response pull-down gate control transistor 117 with a source electrode coupled to the gate electrode of the pull-down transient connectivity limiter transistor 110. The rapid response transistor 117 also has a drain electrode coupled to a primary voltage supply node VDDH and a gate electrode coupled to a secondary voltage supply node VDDL. In operation, the primary voltage supply node VDDH is at a higher voltage than the secondary voltage supply node VDDL. There is also a rapid response pull-up gate control transistor 118 having a source electrode coupled to the gate electrode of the pull-up transient connectivity limiter transistor 111. The rapid response transistor 118 also has a drain electrode coupled to the primary voltage supply node VDDH and a gate electrode coupled to the secondary voltage supply node VDDL.

The rapid response pull-down gate control transistor 117 and the rapid response pull-up gate control transistor 118 are both native threshold voltage transistors having a substantially zero gate to source threshold voltage. As a result, these rapid response transistors 117, 118 can switch from a conducting state to a non-conducting state by relatively small gate to source voltage swings.

When the voltage level shifter 100 is operating, the primary voltage supply node VDDH, the secondary voltage supply node VDDL, and ground GND nodes or rails are operatively coupled to their respective power supply potentials. As an illustrative example, the voltage level for VDDL is 1 volt and the voltage level for VDDH is about 3 volts. Also, input signals or voltage levels at the input node 101 can transition from ground (low) to VDDL (high) and output signals at the output node 102 can transition from ground GND to VDDH. Thus, it will be apparent to a person skilled in the art that inverters 106, 107 typically have their power rails coupled to VDDL, whereas any output buffers or inverters associated with output circuitry of the voltage level shifter 100 typically have their power rails coupled to VDDH.

The rapid response pull-down gate control transistor 117 is biased such that in operation when the first node of the inverter 107 transitions from a low value to a high value, the rapid response pull-down gate control transistor 117 changes from a conducting to a non-conducting state. As a result, the voltage at the gate of the pull-down transient connectivity limiter transistor 110 rises from VDDL to VDDL plus a charge voltage on the first capacitor 112. This switches the pull-down transient connectivity limiter transistor 110 from a sub-threshold region of operation to a saturation region of operation.

When the first node of the inverter 107 transitions from a low value to a high value the second node of the inverter 107 transitions from a high value to a low value. This transition results in the rapid response pull-up gate control transistor 118 changing from a non-conducting state to a conducting state. The voltage at the gate of the pull-up transient connectivity limiter transistor 111 thereby falls from VDDL plus a charge voltage on the second capacitor 113 to VDDL. This switches the pull-up transient connectivity limiter transistor 111 from a saturation region of operation to a sub-threshold region of operation.

In contrast to the above, when the first node of the input inverter 107 transitions from a high value to a low value the rapid response pull-down gate control transistor 117 changes from a non-conducting state to a conducting state. The voltage at the gate of the pull-down transient connectivity limiter transistor 110 thereby falls from VDDL plus a charge voltage on the first capacitor 112 to VDDL. This switches the pull-down transient connectivity limiter transistor 110 from a saturation region of operation sub-threshold region of operation.

Similar to above, when the first node of the input inverter 107 transitions from a high value to a low value the second node of the inverter 107 transitions from a low value to a high value. This transition results in the rapid response pull-up gate control transistor 118 changing from a conducting state to a non-conducting state. The voltage at the gate of the pull-up transient connectivity limiter transistor 111 thereby rises from VDDL to VDDL plus a charge voltage on the second capacitor 113. This switches the pull-up transient connectivity limiter transistor 111 from a sub-threshold region of operation to a saturation region of operation.

The output circuit 105 has a pull-up transistor 114 with source and drain electrodes coupled between the primary voltage supply node VDDH and a drain electrode of the pull-down transient connectivity limiter transistor 110. As shown, the drain electrode of the pull-up transistor 114 is coupled to the pull-down transient connectivity limiter transistor 110 via a pull-down node 124 of the transient path connectivity limiter 104. The drain electrode of the pull-up transistor 114 is also coupled to the output node 102 and a gate electrode of the pull-up transistor 114 is coupled to a drain electrode of the pull-up transient connectivity limiter transistor 111. More specifically, in this embodiment, the drain electrode of the pull-up transistor 114 is coupled to the output node 102 via an output inverter 116.

The output circuit 105 further includes a pull-up control transistor 115 having source and drain electrodes coupled between the primary voltage supply VDDH and the drain electrode of the pull-up transient connectivity limiter transistor 111. As shown, the drain electrode of the pull-up control transistor 115 is coupled to the pull-up transient connectivity limiter transistor 111 via a pull-up control node 125 of the transient path connectivity limiter 104. Further, a gate electrode of the pull-up control transistor 115 is coupled to the drain electrode of the pull-down transient connectivity limiter transistor 110.

Figure 2:
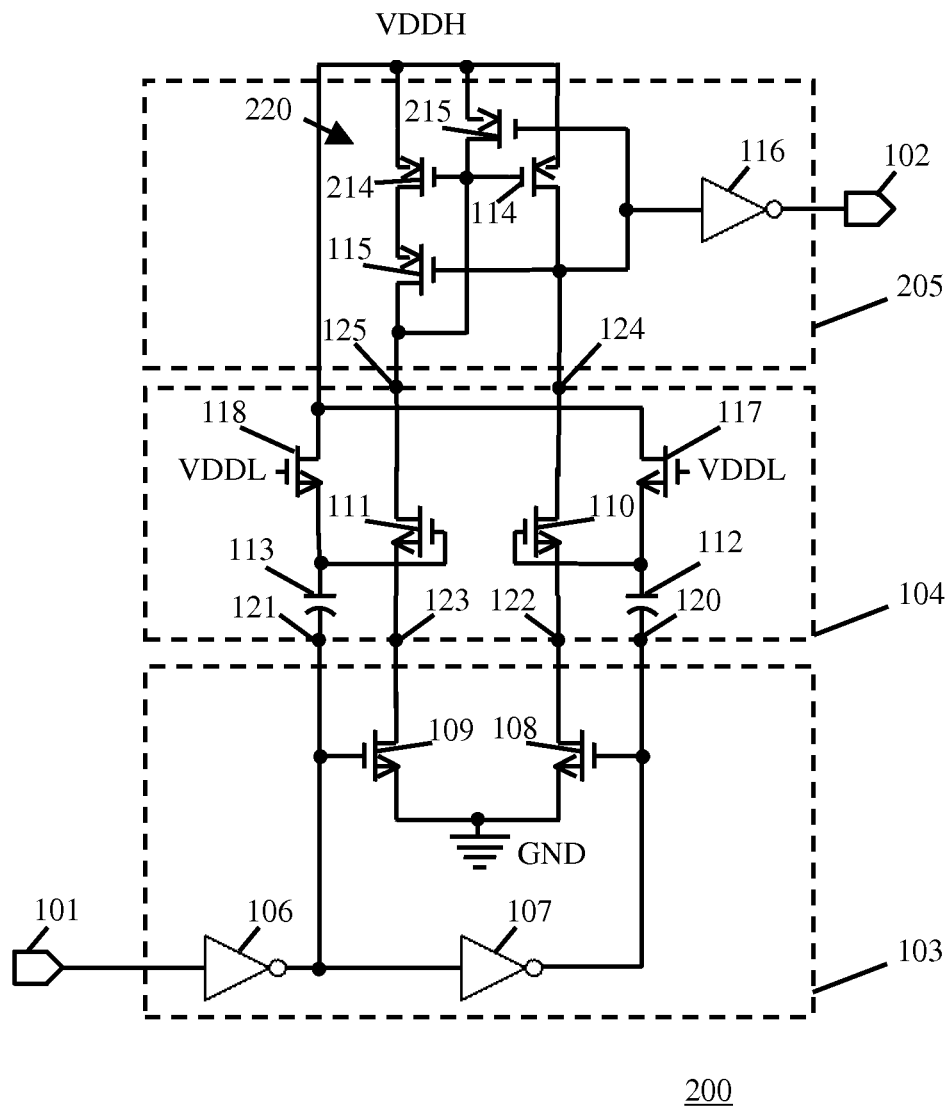
FIG. 2 is a schematic circuit diagram of a voltage level shifter in accordance with another preferred embodiment of the present invention.

Referring to FIG. 2, a circuit diagram of a voltage level shifter 200 in accordance with another preferred embodiment of the present invention is shown. The majority of components and connections of the voltage level shifter 200 are identical to the voltage level shifter 100 and therefore to avoid repetition only the differences will be described. The voltage level shifter 200 has an output circuit 205 that is configured so that the pull-up transistor 114 is part of a current mirror configuration 220. The current mirror configuration 220 includes a mirror transistor 214 coupled between the primary voltage supply VDDH and the source of the pull-up control transistor 115. A gate electrode of the mirror transistor 214 is coupled to the gate electrode of the pull-up transistor 114. The gate electrode of the pull-up transistor 114 is coupled to the primary voltage supply (VDDH) through a mirror control transistor 215 that has a gate electrode coupled directly to the drain electrode of the pull-up transistor 114.

Figure 3:
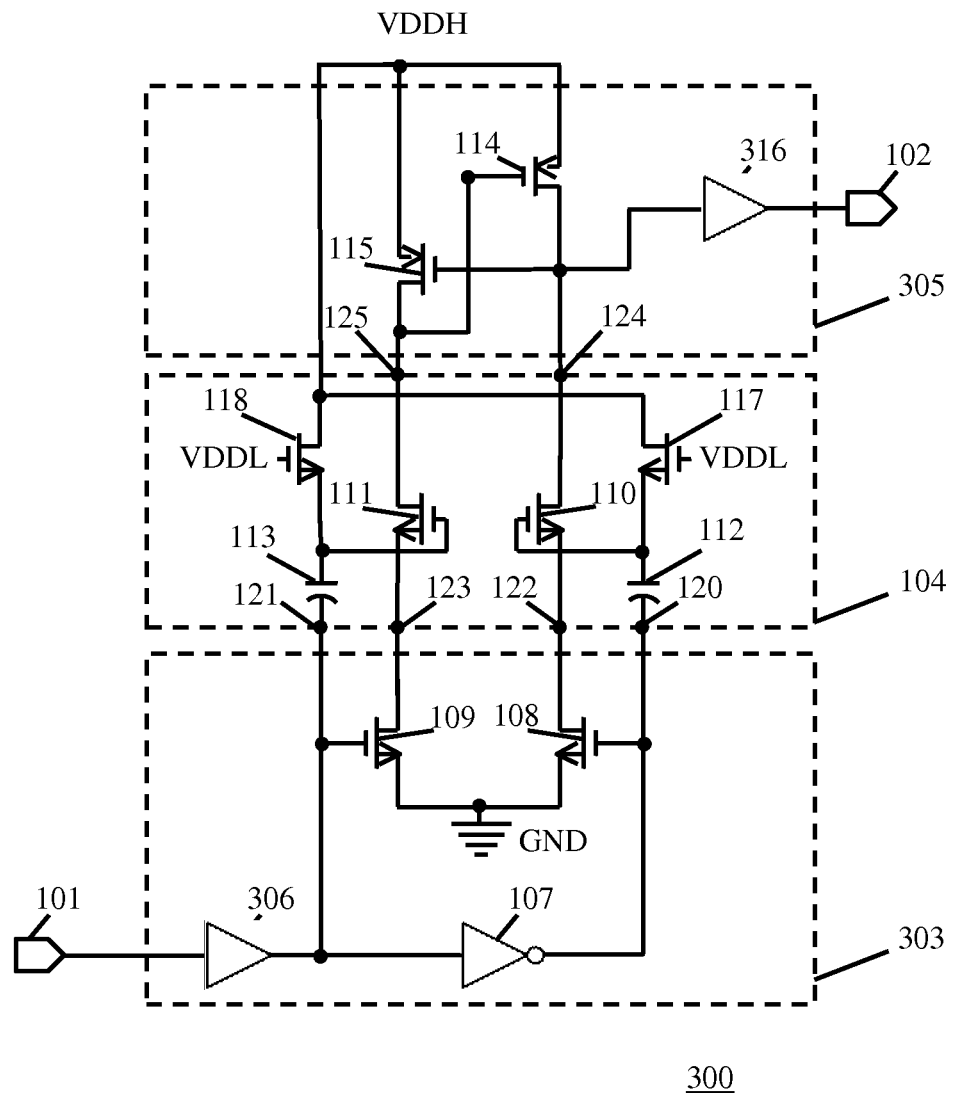
FIG. 3 is a schematic circuit diagram of a voltage level shifter in accordance with another preferred embodiment of the present invention.

Referring to FIG. 3, a circuit diagram of a voltage level shifter 300 in accordance with another embodiment of the present invention is shown. The majority of components and connections of the voltage level shifter 300 are identical to the voltage level shifter 100 and therefore to avoid repetition only the differences will be described. The voltage level shifter 300 has an input circuit 303 with a buffer 306 replacing the inverter 106 (used in the input circuit 103) and provides the coupling between the input node and the second node of the input inverter 107. A modified output circuit 305 has an output buffer 316 replacing the output inverter 116 (used in the output circuit 105) and provides coupling between the drain electrode of the pull-up transistor 114 and the output node 102.

Figure 4:
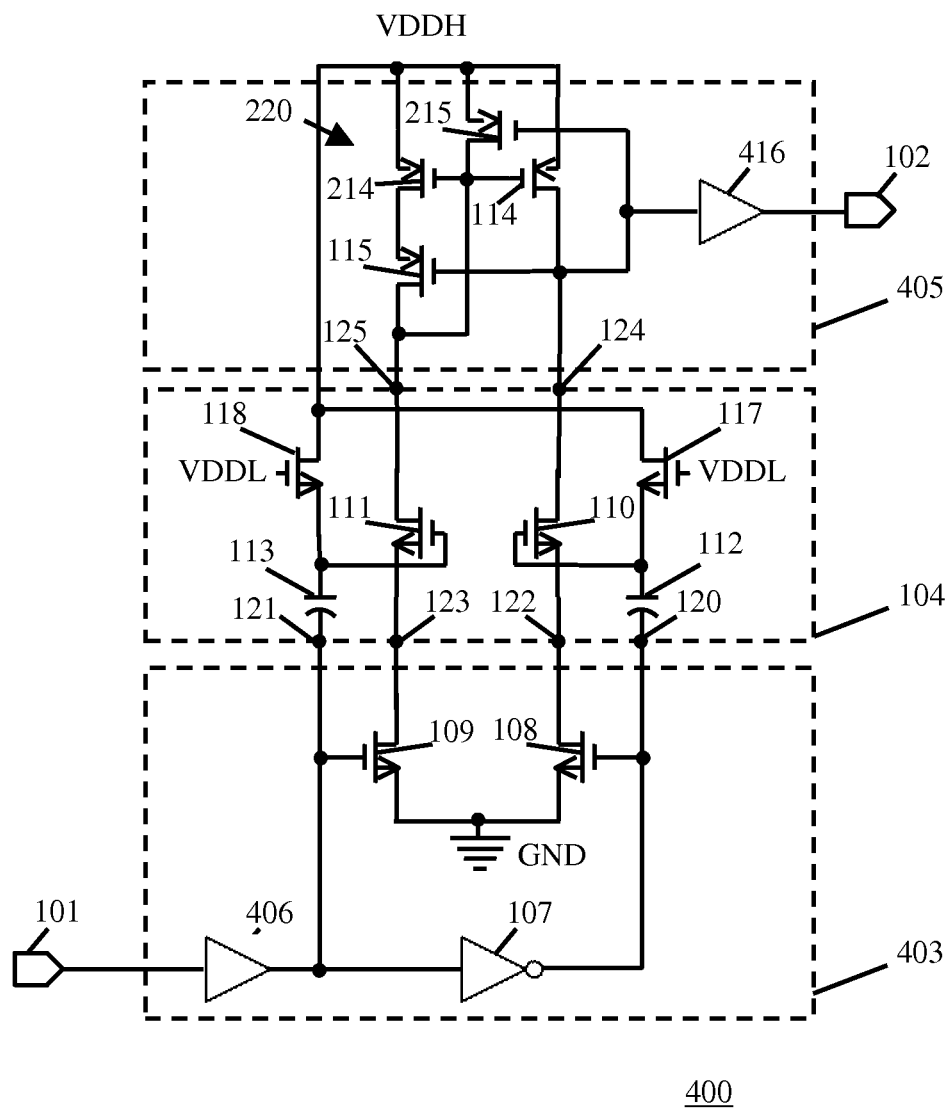
FIG. 4 is a schematic circuit diagram of a voltage level shifter in accordance with another preferred embodiment of the present invention.

Referring to FIG. 4, a circuit diagram of a voltage level shifter 400 in accordance with another embodiment of the present invention is shown. The majority of components and connections of the voltage level shifter 400 are identical to the voltage level shifter 200 and therefore to avoid repetition only the differences will be described. The voltage level shifter 400 has an input circuit 403 with a buffer 406 replacing the inverter 106 (used in the input circuit 103) and provides the coupling between the input node and the second node of the input inverter 107. A modified output circuit 405 has an output buffer 416 replacing the output inverter 116 (used in the output circuit 205) and provides coupling between the drain electrode of the pull-up transistor 114 and the output node 102.

Figure 5:
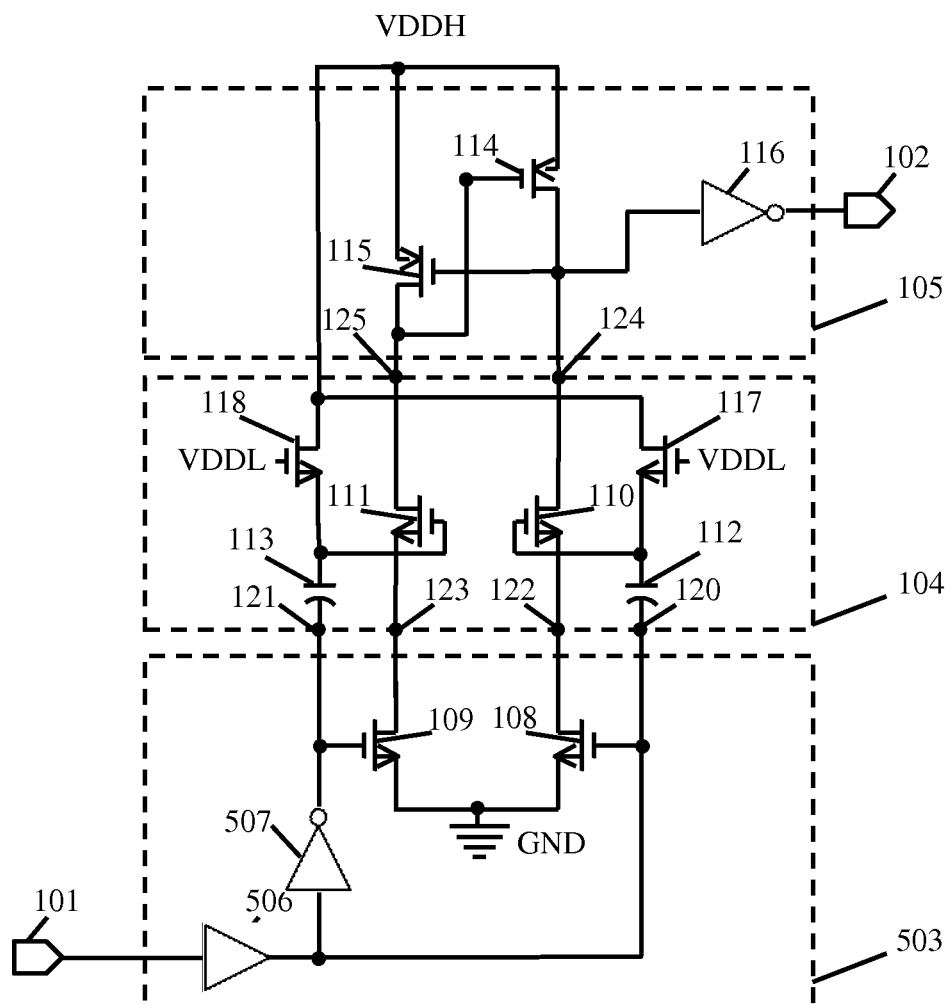
FIG. 5 is a schematic circuit diagram of a voltage level shifter in accordance with a another preferred embodiment of the present invention.

Referring to FIG. 5, a circuit diagram of a voltage level shifter 500 in accordance with another embodiment of the present invention is illustrated. The majority of components and connections of the voltage level shifter 500 are identical to the voltage level shifter 100 and therefore to avoid repetition only the differences will be described. The voltage level shifter 500 has an input circuit 503 with the input inverter 107 (used in the input circuit 103) replaced with an input inverter 507. The pull-down transistor 108 has a gate electrode coupled to a second node (input node) of the inverter 507 and the gate electrode of the pull-up control transistor 109 is coupled to an opposite first node (output node) of the inverter 507. There is a buffer 506 replacing the inverter 106 (used in the input circuit 103) and provides the coupling between the input node 101 and the second node of the input inverter 507.

Figure 6:
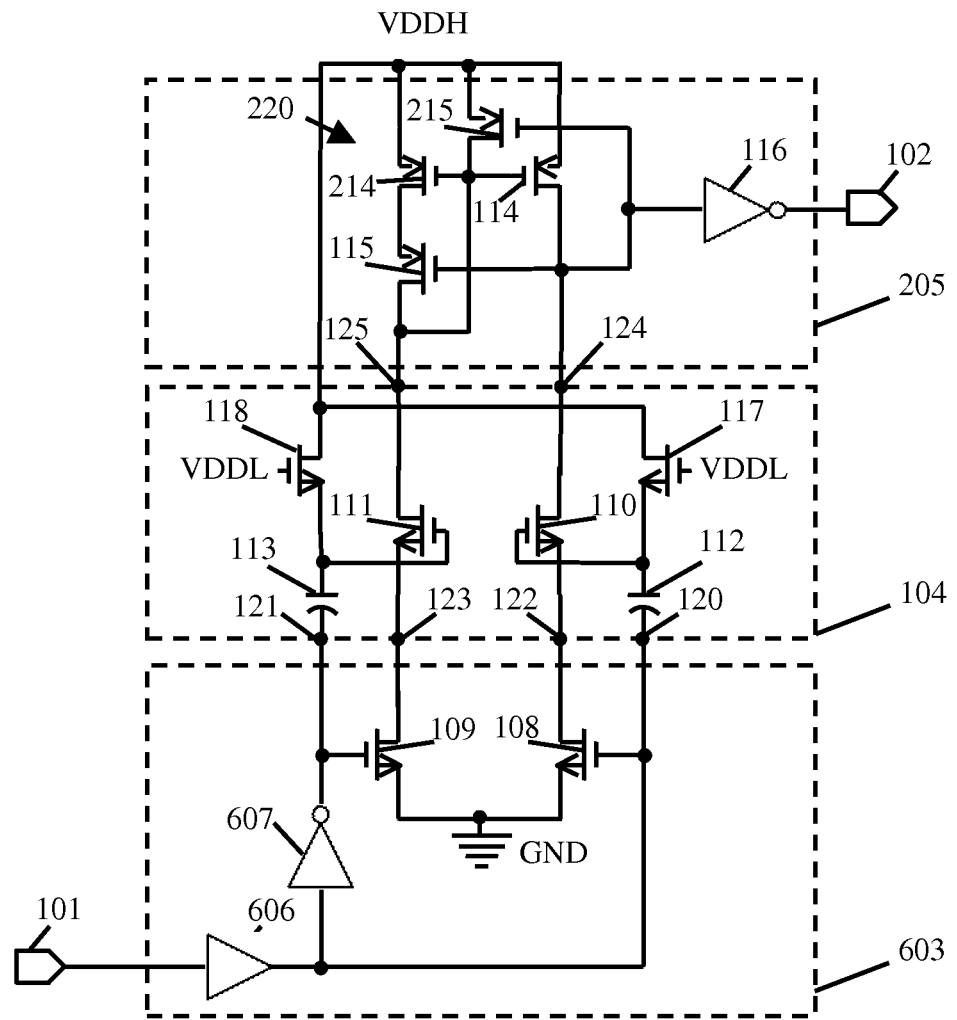
FIG. 6 is a schematic circuit diagram of a voltage level shifter in accordance with yet another preferred embodiment of the present invention.

Referring to FIG. 6, a circuit diagram of a voltage level shifter 600 in accordance with yet another embodiment of the present invention is illustrated. The majority of components and connections of the voltage level shifter 600 are identical to the voltage level shifter 200 and therefore to avoid repetition only the differences will be described. The voltage level shifter 600 has an input circuit 603 with the input inverter 107 (used in the input circuit 103) replaced with an input inverter 607. The pull-down transistor 108 has a gate electrode coupled to a second node (input node) of the inverter 607 and the gate electrode of the pull-up control transistor 109 is coupled to an opposite first node (output node) of the inverter 607. There is a buffer 606 replacing the inverter 106 (used in the input circuit 103) and provides the coupling between the input node and the second node of the input inverter 607.

Advantageously, the present invention provides for a level shifter that does not require relatively high levels of power consumption. In operation, after the pull-down transient connectivity limiter transistor 110 transitions from the saturation region of operation to the sub-threshold region of operation, the pull-down transistor 108 switches off. This therefore reduces the possibility of the level shifter concurrently attempting to pull up and pull down the pull down node 124 and also decreases or eliminates leakage currents. Similarly, after the pull-up transient connectivity limiter transistor 111 transitions from the saturation region of operation to the sub-threshold region of operation, the pull-up control transistor switches off. Again, this reduces the possibility of the level shifter concurrently attempting to pull up and pull down the pull down node 124 and also decreases or eliminates leakage currents.

The current mirror configuration 220 advantageously cuts-off leakage current flowing from the primary voltage supply node VDDH to the low voltage reference node (GND) when the input node 101 is not transitioning between voltage levels.

After the first transition between voltage levels at the input node 101, the pull-down control node 124 is pulled down to the low voltage reference node (GND) through the pull-down transient connectivity limiter transistor 110 and the pull-down transistor 108. As a result the mirror control transistor 215 is turned on (conducting) as its gate is coupled to the pull-down control node 124. The drain electrode of the mirror control transistor 215 will pull up the gate electrodes of the pull-up transistor 114 and the mirror transistor 214 connecting to the primary voltage supply node VDDH. This will turn off the pull-up transistor 114 and the mirror transistor 214 cutting off the leakage paths from the primary voltage supply node VDDH to the low voltage reference node(GND) through the pull-down control node 124 and the pull-up control node 125. The current mirror configuration 220 also provides for rapid responses and can supply a suitable controlled current flow to the output node 102.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A voltage level shifter, comprising:
   an input node and an output node;
   an input circuit with an input inverter coupled to the input node, wherein the input circuit has a pull-down transistor with a gate electrode coupled to a first node of the input inverter and a first pull-up control transistor with a gate electrode coupled to an opposite second node of the input inverter, and wherein source electrodes of the pull-down transistor and the first pull-up control transistor are coupled to a low voltage reference;
   a transient path connectivity limiter with a pull-down transient connectivity limiter transistor and a pull-up transient connectivity limiter transistor, wherein the pull-down transient connectivity limiter transistor has a gate electrode coupled through a first capacitor to the first node of the input inverter and a source electrode of the pull-down transient connectivity limiter transistor is coupled to a drain electrode of the pull-down transistor, and wherein the pull-up transient connectivity limiter transistor has a gate electrode coupled through a second capacitor to the second node of the input inverter and a source electrode of the pull-up transient connectivity limiter transistor is coupled to a drain electrode of the first pull-up control transistor, wherein the transient path connectivity limiter further includes a rapid response pull-down gate control transistor having a source electrode coupled to the gate electrode of the pull-down transient connectivity limiter transistor, a drain electrode coupled to a primary voltage supply node and a gate electrode coupled to a secondary voltage supply node, wherein in operation the primary voltage supply node is at a higher voltage than the secondary voltage supply node; and
   an output circuit having a pull-up transistor with source and drain electrodes coupled between the primary voltage supply node and a drain electrode of the pull-down transient connectivity limiter transistor, wherein the drain electrode of the pull-up transistor is coupled to the output node and a gate electrode of the pull-up transistor is coupled to a drain electrode of the pull-up transient connectivity limiter transistor, and wherein the output circuit further includes a second pull-up control transistor having source and drain electrodes coupled between the primary voltage supply and the drain electrode of the pull-up transient connectivity limiter transistor and a gate electrode of the second pull-up control transistor is coupled to the drain electrode of the pull-down transient connectivity limiter transistor.

2. The voltage level shifter of claim 1, wherein the transient path connectivity limiter further includes a rapid response pull-up gate control transistor having a source electrode coupled to the gate electrode of the pull-up transient connectivity limiter transistor, a drain electrode coupled to the primary voltage supply node and a gate electrode coupled to the secondary voltage supply node.

3. The voltage level shifter of claim 2, wherein the rapid response pull-down gate control transistor is biased such that in operation when the first node of the input inverter transitions from a low value to a high value, the rapid response pull-down gate control transistor changes from a conducting to a non-conducting state, thereby switching the pull-down transient connectivity limiter transistor from a sub-threshold region of operation to a saturation region of operation.

4. The voltage level shifter of claim 3, wherein the rapid response pull-up gate control transistor is biased such that in operation when the first node of the input inverter transitions from a low value to a high value and the second node of the input inverter transitions from a high value to a low value, the rapid response pull-up gate control transistor changes from a non-conducting state to a conducting state, thereby switching the pull-up transient connectivity limiter transistor from a saturation region of operation to a sub-threshold region of operation.

5. The voltage level shifter of claim 4, wherein the rapid response pull-down gate control transistor is biased such that in operation when the first node of the input inverter transitions from a high value to a low value, the rapid response pull-down gate control transistor changes from a non-conducting to a conducting state, thereby switching the pull-down transient connectivity limiter transistor from a saturation region of operation to a sub-threshold region of operation.

6. The voltage level shifter of claim 5, wherein when the first node of the input inverter transitions from a high value to a low value the second node of the input inverter transitions from a low value to a high value resulting in the rapid response pull-up gate control transistor changing from a conducting state to a non-conducting state, thereby switching the a pull-up transient connectivity limiter transistor from a sub-threshold region of operation to a saturation region of operation.

7. The voltage level shifter of claim 6, wherein the rapid response pull-down gate control transistor and the rapid response pull-up gate control transistor are both native threshold voltage transistors having a substantially zero gate to source threshold voltage.

8. The voltage level shifter of claim 7, wherein the input node is coupled to the input inverter via an initial inverter and the drain electrode of the pull-up transistor is coupled to the output node via an output inverter.

9. The voltage level shifter of claim 7, wherein the input node is coupled to the input inverter via an initial buffer and the drain electrode of the pull-up transistor is coupled to the output node via an output buffer.

10. The voltage level shifter of claim 1, wherein the pull-up transistor is part of a current mirror configuration that includes a mirror transistor coupled between the primary voltage supply and the source of the second pull-up control transistor, and a gate electrode of the mirror transistor is coupled to the gate electrode of the pull-up transistor, and wherein the gate electrode of the pull-up transistor is coupled to the primary voltage supply through a mirror control transistor that has a gate electrode coupled directly to the drain electrode of the pull-up transistor.

11. A voltage level shifter, comprising:
an input node and an output node;
an input circuit with an input inverter coupled to the input node, the input circuit including a pull-down transistor with a gate electrode coupled to a first node of the input inverter and a first pull-up control transistor with a gate electrode coupled to an opposite second node of the input inverter, and wherein source electrodes of the pull-down transistor and the first pull-up control transistor are coupled to a low voltage reference node;
a transient path connectivity limiter including
a pull-down transient connectivity limiter (TCL) transistor having a gate electrode coupled through a first capacitor to the first node of the input inverter and a source electrode coupled to a drain electrode of the pull-down transistor,
a pull-up TCL transistor having a gate electrode coupled through a second capacitor to the second node of the input inverter and a source electrode coupled to a drain electrode of the first pull-up control transistor,
two control inputs coupled to the first and second nodes of the input inverter respectively,
path input nodes coupled to respective drain electrodes of the pull-down transistor and the first pull-up control transistor, and
a rapid response pull-down gate control transistor having a source electrode coupled to the gate electrode of the pull-down TCL transistor, a drain electrode coupled to a primary voltage supply node and a gate electrode coupled to a secondary voltage supply node, wherein in operation the primary voltage supply node is at a higher voltage than the secondary voltage supply node; and
an output circuit having a pull-up transistor with source and drain electrodes coupled between the primary voltage supply node and a pull-down node of the transient path connectivity limiter, wherein the drain electrode of the pull-up transistor is coupled to the output node and a gate electrode of the pull-up transistor is coupled to a pull-up control node of the transient path connectivity limiter, and wherein the output circuit further comprises a second pull-up control transistor having source and drain electrodes coupled between the primary voltage supply and the pull-up control node and a gate electrode of the second pull-up control transistor is coupled to the pull-down node, and wherein during a first transition between voltage levels at the input node the transient path connectivity limiter connects the pull-up control node to the low voltage reference node through the pull-up TCL transistor transitioning from a saturation region of operation to a sub-threshold region of operation, and during the first transition between voltage levels at the input node the transient path connectivity limiter further connects the pull-down control node to the low voltage reference node through the pull-down TCL transistor transitioning from a sub-threshold region of operation to a saturation region of operation.

12. The voltage level shifter of claim 11, wherein during a second opposite transition between voltage levels at the input node the transient path connectivity limiter connects the pull-up control node to the low voltage reference node through the pull-up TCL transistor transitioning from the sub-threshold region of operation to the saturation region of operation and wherein during the second opposite transition between voltage levels at the input node the transient path connectivity limiter further connects the pull-down control node to the low voltage reference node through the pull-down TCL transistor transitioning from the saturation region of operation to the sub-threshold region of operation.

13. The voltage level shifter of claim 11, wherein the transient path connectivity limiter further includes a rapid response pull-up gate control transistor having a source electrode coupled to the gate electrode of the pull-up TCL transistor, a drain electrode coupled to the primary voltage supply node and a gate electrode coupled to the secondary voltage supply node.

14. The voltage level shifter of claim 13, wherein the rapid response pull-down gate control transistor is biased such that in operation when the first node of the input inverter transitions from a low value to a high value, the rapid response pull-down gate control transistor changes from a conducting to a non-conducting state, thereby switching the pull-down TCL transistor from a sub-threshold region of operation to a saturation region of operation.

15. The voltage level shifter of claim 14, wherein the rapid response pull-up gate control transistor is biased such that in operation when the second node of the input inverter is in transition from a low value to a high value, the rapid response pull-up gate control transistor changes from a conducting to a non-conducting state, thereby switching the pull-up TCL transistor from a sub-threshold region of operation to a saturation region of operation.

16. The voltage level shifter of claim 15, wherein the pull-up transistor is part of a current mirror configuration that includes a mirror transistor coupled between the primary voltage supply and the source of the second pull-up control transistor, and a gate electrode of the mirror transistor is coupled to the gate electrode of the pull-up transistor, and wherein the gate electrode of the pull-up transistor is coupled to the primary voltage supply through a mirror control transistor that has a gate electrode coupled directly to the drain electrode of the pull-up transistor.

17. The voltage level shifter of claim 16, wherein, in operation, after the pull-down TCL transistor transitions from the saturation region of operation to the sub-threshold region of operation, the pull-down transistor switches off, and wherein after the pull-up TCL transistor transitions from the saturation region of operation to the sub-threshold region of operation the first pull-up control transistor switches off.

* * * * *